(12) United States Patent
Prince

(10) Patent No.: US 7,864,336 B2
(45) Date of Patent: Jan. 4, 2011

(54) COMPACT LITTROW ENCODER

(75) Inventor: James Prince, San Jose, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 275 days.

(21) Appl. No.: 12/111,081

(22) Filed: Apr. 28, 2008

(65) Prior Publication Data
US 2009/0268210 A1 Oct. 29, 2009

(51) Int. Cl.
*G01B 11/02* (2006.01)
(52) U.S. Cl. ..................... 356/499
(58) Field of Classification Search ............. 356/494, 356/499, 521; 250/237 G
See application file for complete search history.

(56) References Cited

U.S. PATENT DOCUMENTS

| | | | | |
|---|---|---|---|---|
| 4,930,895 A * | 6/1990 | Nishimura et al. | ........... | 356/494 |
| 5,017,777 A * | 5/1991 | Ishizuka et al. | ........ | 250/231.16 |
| 5,035,507 A * | 7/1991 | Nishioki et al. | ............. | 356/499 |
| 5,066,130 A * | 11/1991 | Tsukiji et al. | ................ | 356/494 |
| 5,104,225 A * | 4/1992 | Masreliez | ................... | 356/494 |
| 5,113,071 A * | 5/1992 | Sawada et al. | .......... | 250/237 G |
| 5,146,085 A * | 9/1992 | Ishizuka et al. | ........ | 250/231.16 |
| 5,424,829 A * | 6/1995 | Sato et al. | .................... | 356/499 |
| 5,499,096 A * | 3/1996 | Tamiya | ........................ | 356/494 |
| 5,517,307 A * | 5/1996 | Buehring et al. | ............. | 356/494 |
| 5,532,819 A * | 7/1996 | Ishizuka et al. | ............. | 356/494 |
| 6,407,815 B2 * | 6/2002 | Akihiro | ........................ | 356/499 |
| 6,469,790 B1 * | 10/2002 | Manning | ..................... | 356/451 |
| 6,744,520 B2 * | 6/2004 | Chang et al. | ................. | 356/499 |
| 6,919,561 B2 * | 7/2005 | Lee et al. | ................. | 250/237 G |
| 7,034,948 B2 * | 4/2006 | Tamiya et al. | ................ | 356/499 |
| 7,187,451 B2 * | 3/2007 | Kao et al. | .................... | 356/499 |
| 7,394,550 B2 * | 7/2008 | Takahashi et al. | ........... | 356/499 |
| 7,440,113 B2 * | 10/2008 | Trutna et al. | ................. | 356/499 |
| 7,471,397 B2 * | 12/2008 | Holzapfel | .................... | 356/494 |
| 7,554,675 B2 * | 6/2009 | Takeshita et al. | ............ | 356/521 |
| 7,561,280 B2 * | 7/2009 | Schluchter et al. | .......... | 356/499 |
| 2003/0098411 A1 * | 5/2003 | Lee et al. | ................. | 250/237 G |
| 2007/0146722 A1 * | 6/2007 | Trutna et al. | ................ | 356/487 |

* cited by examiner

*Primary Examiner*—Gregory J Toatley
*Assistant Examiner*—Scott M Richey

(57) ABSTRACT

A Littrow encoder is disclosed. The encoder includes first and second interferometers and a beam splitter assembly that splits a first instrument light beam into first and second interferometer input beams and directs these beams into the first and second interferometers, respectively. Each interferometer generates a measurement beam and a reference beam and directs the measurement beam toward a grating on a surface from which the measurement beam is diffracted, the measurement beam from the first interferometer striking the surface at a Littrow angle that is the negative of the angle at which the measurement beam from the second interferometers strikes that surface. Each interferometer includes at least one intensity detector that generates a signal related to an intensity of light in a combined light beam that includes the reference and measurement beams from that interferometer.

16 Claims, 10 Drawing Sheets

COMPACT LITTROW ENCODER

BACKGROUND OF THE INVENTION

Optical interferometers are often used to make precise displacement measurements. For example, in semiconductor processing applications, a stage having a wafer mounted thereon must be positioned with respect to a projector that projects an image used in the lithographic processing of the wafer. The accuracy needed in this positioning operation depends on the feature size of the fabrication process being utilized; hence, as feature sizes have decreased, there is a need for ever more precise positioning mechanisms, and hence, devices for measuring the position of the stage.

In one class of interferometers, a light beam generated by a laser is split into two beams. One beam is reflected from the device that moves and whose position is to be measured, and the other beam is reflected from a reference mirror whose position does not change. The two beams are then combined and the interference patterns observed to provide a measurement of the change in position of the device. Typically, a mirror is placed on a surface of the device and the measurement laser beam traverses a path through the air from the interferometer to the mirror and back. The interferometer measures the change in optical path length between the reference beam and the measurement beam. The optical path length depends both on the distance from the interferometer to the device and the index of refraction of the material through which the beam travels. Hence, a change in the index of refraction cannot be distinguished from a change in position of the device being measured. The index of refraction of the air between the interferometer and the mirror can change due to many environmental factors such as temperature fluctuations, and hence, becomes problematic when very high precision measurements are required.

Accordingly, interferometer designs in which the light beam must traverse a significant distance in air have significant problems meeting the precision required in many applications. The laser interferometer described above requires a light path in air that is at least as long as the largest displacement of the stage being measured. Hence, paths of the order of 12 inches in air are required for the largest wafers currently used in semiconductor processing.

One method for avoiding long paths is to use a form of encoder in which the distance between the measurement device and the stage does not change significantly when the stage moves in the direction of measurement. Conventional optical encoders are examples of such devices. In such encoders, a pattern is attached to the stage such that the pattern moves past a detection head that measures the pattern by the reflection or transmission of a light beam. An encoder of this type is described in a co-pending US patent application 2007/0146722 filed on Dec. 23, 2005. However, providing an encoder of this type that can be reduced to a convenient package size has remained problematic for many applications.

SUMMARY OF THE INVENTION

The invention includes a Littrow encoder. The encoder includes first and second interferometer cores and a beam splitter assembly. The beam splitter assembly splits a first instrument light beam into first and second interferometer input beams and directs the first and second interferometer light beams into the first and second interferometer cores, respectively. Each interferometer core generates a measurement beam and a reference beam from the input beam to that interferometer core and directs the measurement beam toward a grating surface from which the measurement beam is diffracted at the Littrow condition, the measurement beam from the first interferometer core striking the surface at an angle relative to the normal to that surface that is the negative of the angle at which the measurement beam from the other of the interferometer cores strikes that surface. Each interferometer core includes an intensity detector that generates a signal related to an intensity of light in a combined light beam that includes the reference and measurement beams from that interferometer core. An optical grating is mounted on the surface and the angle at which the measurements strike the grating is a Littrow angle of the optical grating. In one embodiment, the beam splitter assembly includes an optical element that includes a transparent medium that is bonded to the first and second interferometer cores. In another embodiment of the invention, the optical element includes a non-polarization dependent beam splitter such as a partially reflecting mirror or a grating. In yet another embodiment, the encoder includes a beam expanding optical assembly that receives a second instrument light beam characterized by a first cross-sectional area and converts the second instrument light beam to the first instrument light beam, the first instrument light beam having a cross-sectional area greater than the first cross-sectional area and is a collimated light beam. In a still further embodiment of the invention, the beam expanding optical assembly includes an optical fiber that transmits the second instrument light beam and a collimating optical assembly that converts diverging light from the optical fiber to the first instrument light beam. Embodiments based on either homodyne or heterodyne interferometer cores can be constructed. In another embodiment of the present invention, a housing surrounds the interferometer cores and beam splitter assembly. The housing includes an optically transparent window positioned to pass the measurement beams generated by the first and second interferometer cores. The housing can also include a temperature control module that regulates the temperature in the housing.

BRIEF DESCRIPTION OF THE DRAWINGS

FIG. 6 is top view of detector assembly shown in FIG. 4.

DETAILED DESCRIPTION OF THE PREFERRED EMBODIMENTS OF THE INVENTION

Figure 1:
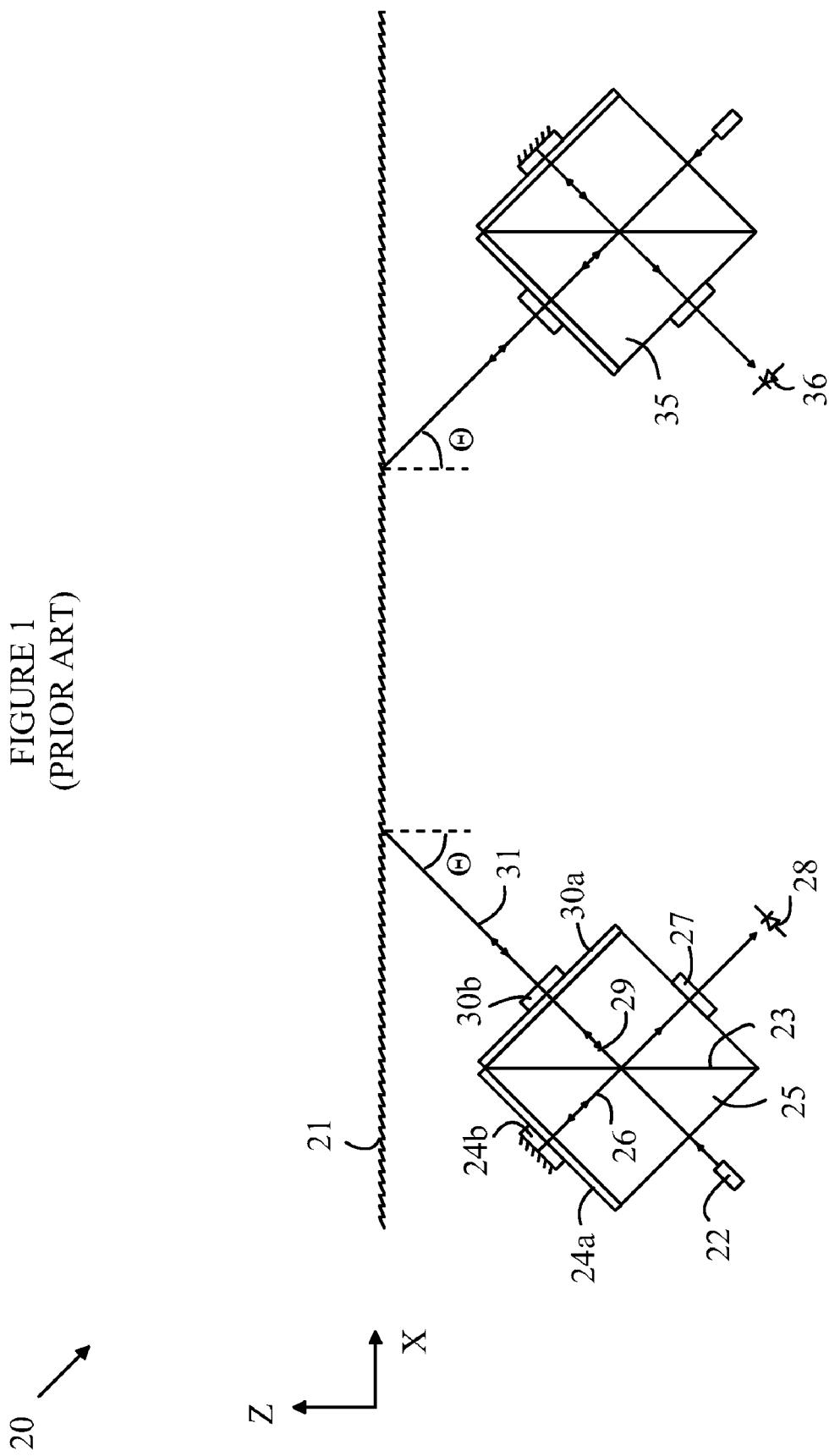
FIG. 1 illustrates a prior art Littrow encoder.

The manner in which the present invention provides its advantages can be more easily understood with reference to FIG. 1, which illustrates a prior art Littrow encoder of the type described in the above-referenced co-pending US patent application. The encoder includes two interferometer cores shown at 25 and 35 and a grating 21. Linearly polarized light from a first light source 22 enters core 25. For the purposes of this discussion, it will be assumed that light source 22 generates a light beam that includes two light components having slightly different frequencies and orthogonal linear polarizations. A polarizing beam splitter 23 passes one of the components path 29, (which is then diffracted at the Littrow condition from grating 21) and reflects the other into a path 26. The light on path 26 has its polarization rotated by 90 degrees by the combination of a halfwave retarder 24a and a Faraday rotator 24b and is reflected back toward beam splitter 23. This light is now passed by beam splitter 23 toward a polarization mixing element 27 and is imaged onto detector 28.

The light on path 29 is processed in an analogous fashion, except that the light is diffracted at the Littrow condition from grating 21 and has a phase shift that depends on the displacement of the grating in the x and z directions. The polarization of the light on path 29 is rotated through 90 degrees after the light passes through the combination of halfwave retarder 30a and Faraday rotator 30b twice, once in each direction. Hence, the light is reflected at beam splitter 23 on its return and directed into detector 28 after passing through a polarization mixing element 27.

As noted above, encoder 20 depends on the light that is diffracted from grating 21 having a phase shift that depends on the position of the grating in x and z. This phase shift results in fringes that are detected by detector 28 when the grating moves in x and z. This phenomenon requires that the diffracted beam from grating 21 be collinear with the incident beam on path 31. This requirement will be met if the incident beam is incident at a Littrow angle. If the grating has a pitch, p, the Littrow angle is given by $$\theta=\sin^{-1}(\lambda/2p),$$

where $\lambda$ is the wavelength of the light. In addition, the polarization of the light incident on the grating is approximately linear with a polarization direction parallel to that of the grating lines. The combination of halfwave retarder 30a and Faraday rotator 30b assures that the light striking grating 21 is linearly polarized while providing the required polarization rotation needed to cause the light to be reflected from beam splitter 23.

The reference and measurement beams generated by light source 22 have different frequencies, and hence, the output of detector 28 will be a signal having an amplitude that varies sinusoidally at a frequency equal to the difference of these two frequencies. As the grating moves, fringes will be detected on this signal. The number of fringes generated when the grating moves a distance $\Delta x$ in the x-direction and $\Delta z$ in the x-direction is given by $$N_1=(\Delta x+\Delta z|\cot(\theta)|)/p$$

Since the number of fringes depends on both $\Delta x$ and $\Delta z$ an additional interference measurement must be made if motion in both directions is possible. One method for providing the additional information is to use a second interferometer core such as core 35 that directs the measurement toward the grating such that the diffraction order responsible for the diffraction of the light is the negative of that utilized by interferometer core 25. The number of fringes counted by detector 36 is given by $$N_2=(-\Delta x+\Delta z|\cot(\theta)|)/p$$

Hence, by solving these two equations, values of both $\Delta x$ and $\Delta z$ can be obtained. In particular $$\Delta x=p(N_1-N_2)/2 \text{ and}$$

$$\Delta z=p(N_1+N_2)|\tan(\theta)|/2.$$

It should be noted that displacement in the x-direction is the difference of the two fringe counts, and hence, errors arising from sources that are common to both fringe counts cancel. In particular, a change in the index of refraction of the air or a change in the wavelength of the light source give rise to errors that are canceled by the subtraction.

Figure 2A:
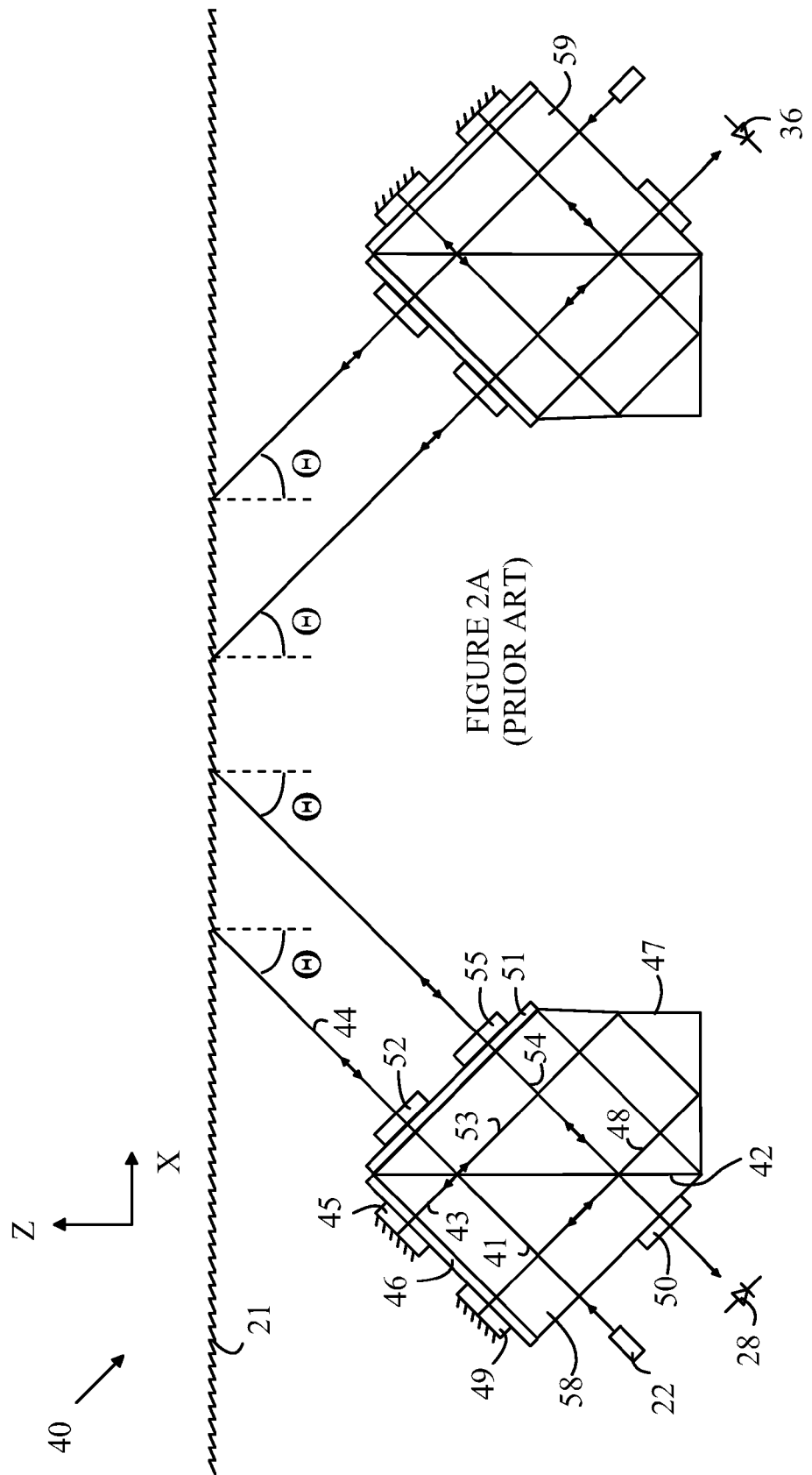
FIG. 2A illustrates a Littrow encoder that utilizes two pass interferometer cores.

The arrangement shown in FIG. 1 is sensitive to tilt errors in the placement of the components. This sensitivity can be reduced by replacing the one pass interferometer cores shown in FIG. 1 with two pass interferometer cores. Refer now to FIG. 2A, which illustrates a Littrow encoder 40 that utilizes two pass interferometer cores 58 and 59. Referring to core 58, the light beam from light source 22 having two components at different frequencies and orthogonal polarizations is directed to polarization dependent beam splitter 42 along path 41. One of the components is reflected along path 43 and becomes the reference beam. The other component passes through beam splitter 42 and becomes the measurement beam that travels along path 44 through halfwave retarder 51 and Faraday rotator 52.

The reference beam is reflected from a mirror on the back surface of Faraday rotator 45 after passing through halfwave retarder 46. The interaction with halfwave retarder 46 and Faraday rotator 45 rotates the polarization of the reference beam by 90 degrees, and hence, the reference beam now passes through beam splitter 42 along path 53 and is reflected by cube corner reflector 47 onto path 48. The reference beam then passes through beam splitter 42 and is reflected back by the mirror on the back surface of Faraday rotator 49. The interaction of the beam with halfwave retarder 46 and Faraday rotator 49 rotates the polarization of the reference beam by 90 degrees, and hence, the reference beam is reflected by beam splitter 42 through polarization mixing optic 50 onto detector 28.

The measurement beam on path 44 is diffracted at the Littrow condition by the grating and strikes beam splitter 42 with a polarization that has been rotated by 90 degrees due to the interaction of the measurement beam with halfwave retarder 51 and Faraday rotator 52. The measurement beam is reflected by beam splitter 42 onto path 53. The measurement beam is then reflected by cube corner reflector 47 onto path 48 with a polarization such that the measurement beam is reflected by beam splitter 42 onto path 54. After striking the grating a second time, the measurement beam returns through Faraday rotator 55 and halfwave retarder 51. The interaction of the measurement beam with Faraday rotator 55 and halfwave retarder 51 causes the polarization of the measurement beam to be rotated by 90 degrees, and hence, the measurement beam passes through beam splitter 42 and is combined with the reference beam.

The encoder shown in FIG. 2A is a heterodyne encoder, i.e., the measurement and reference beams have different frequencies. In this case, the combined beams create a beat signal in a single detector, and hence, the mixed signal resulting from the combining of the measurement and reference beams can be detected by detecting the component of the signal from a single photodiode that is at the beat frequency. However, as will be explained in more detail below, creating two beams of different frequencies and orthogonal polarizations that are delivered to the interferometers that presents problems that can be overcome by using a homodyne version of the interferometers.

Figure 2B:
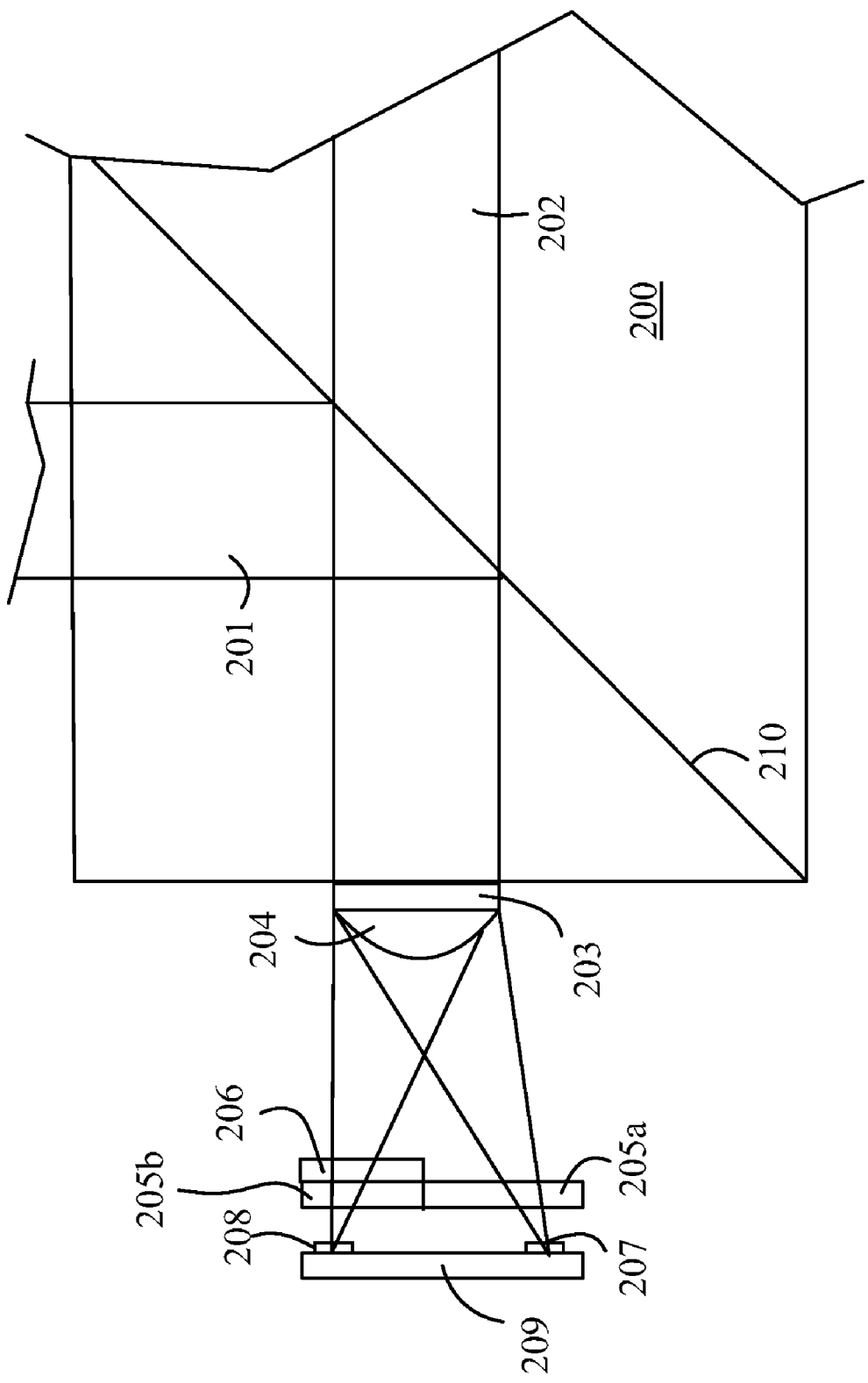
FIG. 2B is a cross-sectional view of the optical elements at the exit portion of each interferometer in a homodyne version of a Littrow encoder.

In a homodyne version of an encoder, the detector assembly in each interferometer must provide both an in-phase and quadrature signal so that both the direction and distance of the displacement can be detected. The quadrature signal is delayed in phase by 90 degrees relative to the in-phase signal. Refer now to FIG. 2B, which is a cross-sectional view of the optical elements at the exit portion of each interferometer in a homodyne version of a Littrow encoder. To simplify the following discussion, only the output optical elements of one of the encoders is shown. In addition, only the portion of the optics at the output of the beam splitter 200 is shown in this cross-sectional view.

The reference beam and measurement beams 201 and 202, respectively, are redirected out of beam splitter 200 by polarization dependent beam splitter 210 and into a beam splitting grating 203 and lens 204 that splits each beam into two output beams that are focused to different physical locations. These beams are used to generate the in phase and quadrature signals needed to detect the direction of motion of the interferometer relative to the grating. One of these two output beams is delayed in phase by 90 degrees relative to the other beam by a retarder 206. Each output beam has a portion of the original measurement and reference beams; however, these beams have not yet been mixed because their polarizations are orthogonal to one another. The beams are mixed by polarizers 205a and 205b. Polarizer 205a has an axis that is at 45 degrees to the direction of polarization of each of the measurement and reference beams. Polarizer 205b has an axis at either 0 degrees or 90 degrees to the direction of polarization of each of the measurement and reference beams. The intensity of the mixed beams is then measured by photodiodes 207 and 208 whose outputs become the in-phase and quadrature signals from the interferometer in question.

These photodiodes are typically mounted on a substrate 209 that may also include other electrical components. Alternatively, the mixed beams could be focused into optical fibers that route the beams to photodiodes that are located at a point remote from the interferometer.

In high precision encoders, the diameter of the measurement beams is an important consideration. Any practical grating has imperfections. These imperfections lead to differences in the distance along the grating corresponding to a single fringe detected by the detectors. The differences between an ideal grating and any practical measurement grating are a function of the location of the interferometers relative to the measurement grating. These variations are typically mapped by calibrating the encoder and a correction is then applied to the actual measurements made by the encoder. The measurement beam measures the phase of the grating averaged over the area of the beam. If the area is large compared to the imperfections, then the variation in the average phase as a function of position is reduced. Accordingly, the number of calibration points required to characterize the grating, and hence the time for calibration, is substantially reduced. Hence, systems having relatively large beam diameters are advantageous. However, such systems require larger interferometers, and hence, larger measurement gratings. It should be noted that the cost of the measurement grating is a significant fraction of the cost of the measurement system; hence, there is a trade off between beam diameter and system cost.

The above-described embodiments utilize two light sources. The light sources must have the same wavelength within a very high degree of precision in high-precision encoders. To provide the desired degree of precision, the light from a single light source can be split into two beams having the required polarization; however, an arrangement that provides a compact encoder utilizing this scheme presents design challenges.

Figure 3:
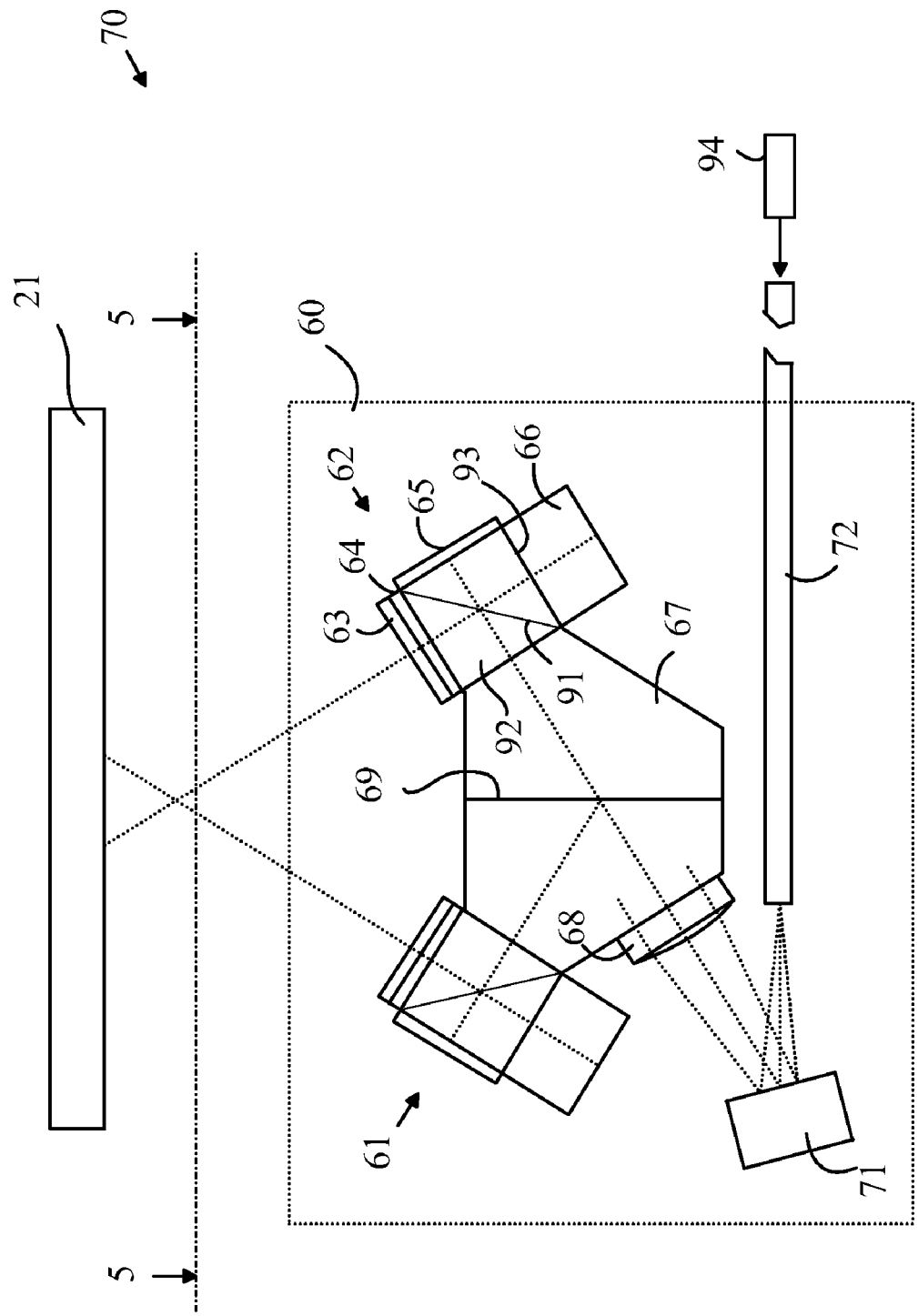
FIG. 3 is a cross-sectional view of Littrow encoder 70 through line 3-3 shown in FIG. 5.
Figure 4:
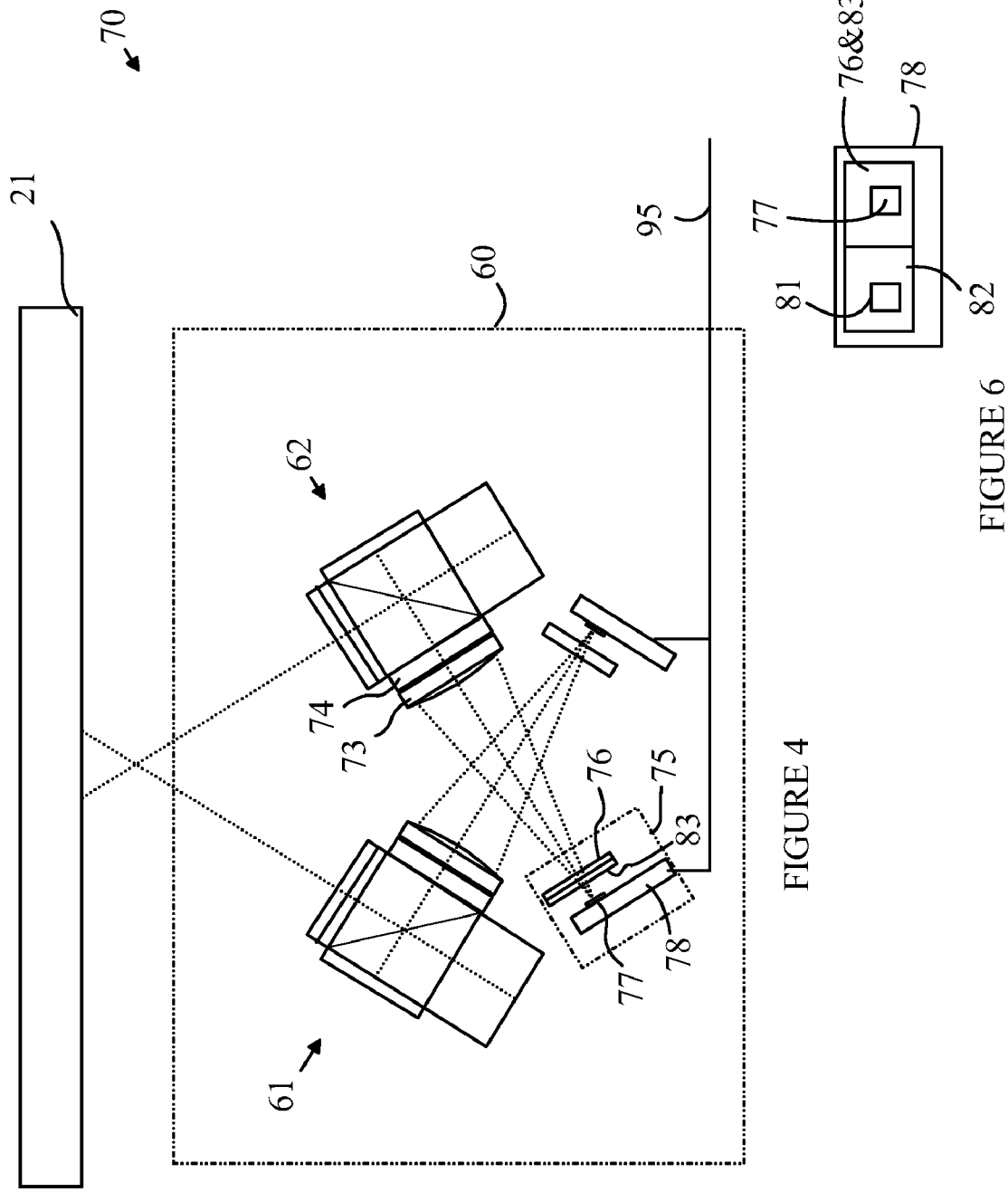
FIG. 4 is a cross-sectional view of Littrow encoder 70 through line 4-4 shown in FIG. 5.
Figure 5:
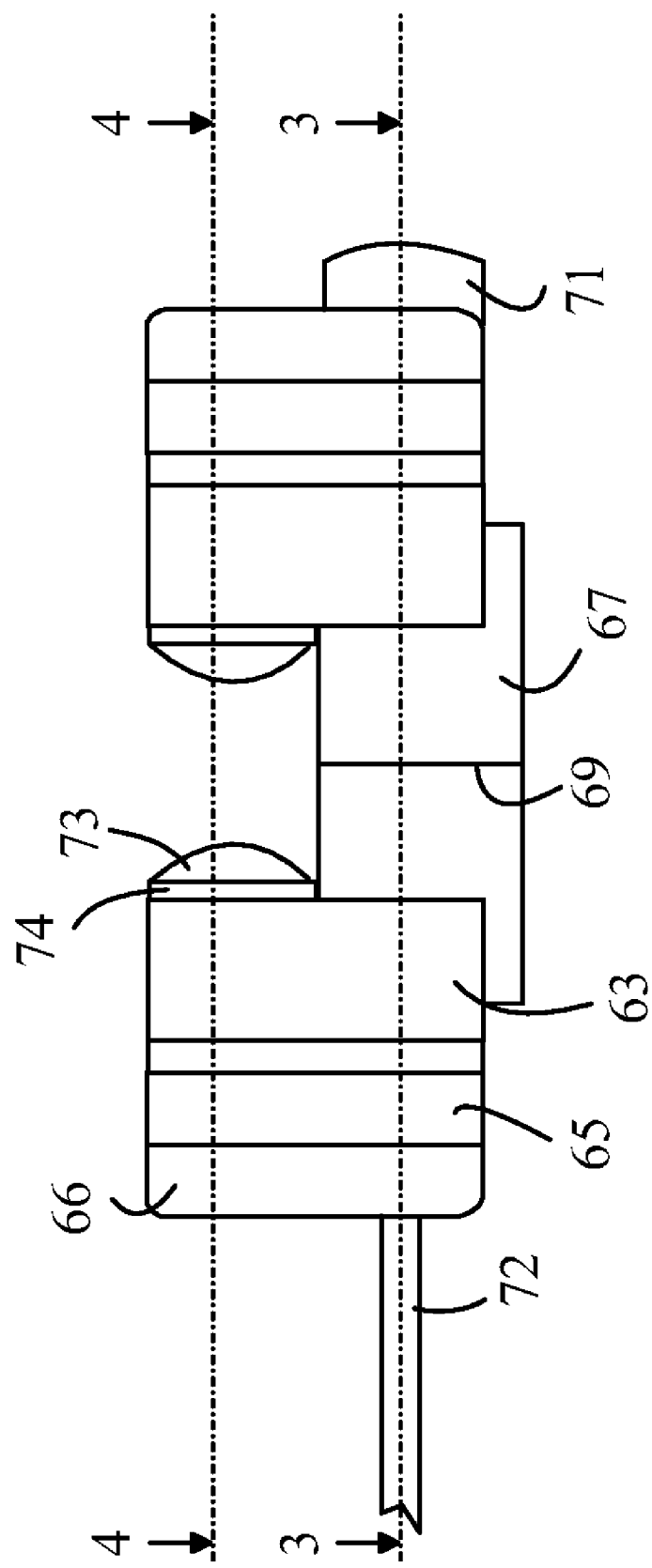
FIG. 5 is a top view of optical assembly 60 as seen from a position between the grating 21 and optical assembly 60 shown at 5-5 in FIG. 3.

The present invention provides a compact Littrow encoder, which has large beam diameters and a single light source. Refer now to FIGS. 3-6, which illustrate a Littrow encoder according to one embodiment of the present invention. Littrow encoder 70 can be viewed as having a grating 21 and an optical assembly 60. FIGS. 3 and 4 are cross-sectional views of Littrow encoder 70 through two different planes that are perpendicular to grating 21. The plane shown in FIG. 3 will be referred to as the input plane, and the plane shown in FIG. 4 will be referred to as the output plane in the following discussion. FIG. 5 is a top view of optical assembly 60 as seen from a position between grating 21 and optical assembly 60 shown at 5-5 in FIG. 3. FIG. 3 is a cross-sectional view of a Littrow encoder 70 through line 3-3 shown in FIG. 5, and FIG. 4 is a cross-sectional view of a Littrow encoder 70 through line 4-4 shown in FIG. 5. FIG. 6 is top view of detector assembly 75 shown in FIG. 4.

Refer now to FIG. 3, which, as noted above, is a cross-sectional view of the input plane of Littrow encoder 70. Optical assembly 60 includes two double pass interferometers 61 and 62. Since the interferometers are similar in construction, only interferometer 62 will be discussed in detail here. Interferometer 62 includes a polarization dependent beam splitter 91 that is internal to a rectangular optical component 92. In this embodiment, the polarization of the light entering optical element 92 is adjusted such that approximately half of the input light is reflected from beam splitter 91 and the other half is transmitted by beam splitter 91. The reflected light forms the measurement beam that is directed to grating 21, and the transmitted light forms the reference beam that is reflected by a mirror coating on the outer surface of a polarization rotating element 65.

Optical element 62 also includes a cube corner reflector 66 that redirects any light that strikes reflector 66 to a direction parallel to the input direction of that light and displaced from that input direction. Reflector 66 has three faces that reflect the light such that a beam that enters reflector 66 is reflected from all three surfaces. Reflector 66 can be viewed as a pyramid structure in which all three planes come together at the apex, the planes intersecting one another at 90 degrees. During the fabrication of interferometer 60, a pyramid structure of this type is bonded to surface 93. The base of the pyramid is larger than the rectangular face 93 of element 92. The overhanging material can be removed to provide a structure that has walls that are coextensive with those of element 92 at the point of bonding of the two structures. To simplify the drawings, the details of the various angles in corner reflector 66 after the bonding and removal of the excess material have been omitted from the drawings.

The measurement beam passes through a halfwave retarder 64 and a Faraday rotator 63 on each pass that is diffracted from grating 21. The measurement beam is likewise reflected from cube corner reflector 66. Cube corner reflector 66 alters the plane in which the reference beam and measurement beam exit interferometer 62 to the output plane. The details of the output plane will be discussed in more detail below.

As noted above, the input light beams to each of the interferometers is derived from a single linear polarized light source such as a laser. In this embodiment of the present invention, light source 94 is remote from optical assembly 60. The light from source 94 is injected into a polarization maintaining optical fiber 72 that delivers that light with the appropriate polarization alignment to a turning mirror 71 within optical assembly 60. The light beam from fiber 72 expands upon leaving fiber 72 and is collimated by a collimating assembly 68 to form a parallel beam of light of the desired diameter. The output of collimating assembly 68 is split into two beams by a non-polarizing beam splitter 69 to form the input beams to interferometers 61 and 62.

Beam splitter 69 is included in a support component 67 to which the interferometers 61 and 62 are attached. Support component 67 aligns the interferometers at the desired angles with respect to grating 21. Support component 67 is preferably constructed from the same optically transparent material as the interferometers and retro reflectors. Support component 67 provides for a symmetric placement of interferometers 61 and 62 relative to grating 21. These design considerations minimize measurement errors due to changes in temperature made by the Littrow encoder.

Refer now to FIG. 4, which is a cross-sectional view of the output plane of Littrow encoder 70. As noted above, after the measurement beams and reference beams have been reflected from the cube corner reflectors, the beams are offset in space. In Littrow encoder 70, the beams are offset such that the beams are confined to an output plane that is centered on line 4-4 shown in FIG. 5 and that is parallel to the input plane shown in FIG. 3. Support component 67 is not present in the output plane; however, the additional components shown in the output plane that are not attached to one of the interferometers can be attached to support component 67. To simplify the drawing, such attachments have been omitted.

As noted above, with a homodyne interferometer, each output beam is split using a grating such as grating 74 and an imaging lens such as lens 73 to form two output beams that are delivered to a detector assembly corresponding to each of the interferometers. The detector assembly corresponding to interferometer 62 is shown at 75 in a cross-sectional view. A top view of detector assembly 75 is shown in FIG. 6. The two beams created by grating 74 are focused onto detectors 77 and 81, respectively, that are mounted on a substrate 78. The beam that is focused onto detector 77 is retarded by a half wave plate 76. This beam then passes through a polarization mixing device 83 before arriving at detector 77. Mixing device 83 is constructed from a polarization filter that has its axis either parallel to, or orthogonal to, the polarizations of each of the beams. The other beam passes through a polarization mixing device 82 that typically consists of a polarization filter having its axis rotated at 45 degrees with respect to the polarizations of each of the beams. The signals from the two detectors are routed out of Littrow encoder 70 on a cable 95 to an external electronics assembly that performs the detection of the displacement from the signals generated by the detectors. While Littrow encoder 70 includes detectors within the optical assembly 60, embodiments in which the detectors are replaced by input apertures to optical fibers can also be constructed. The optical fibers replace cable 95 and deliver the light to detectors that are remote from the optical assembly.

Figure 7:
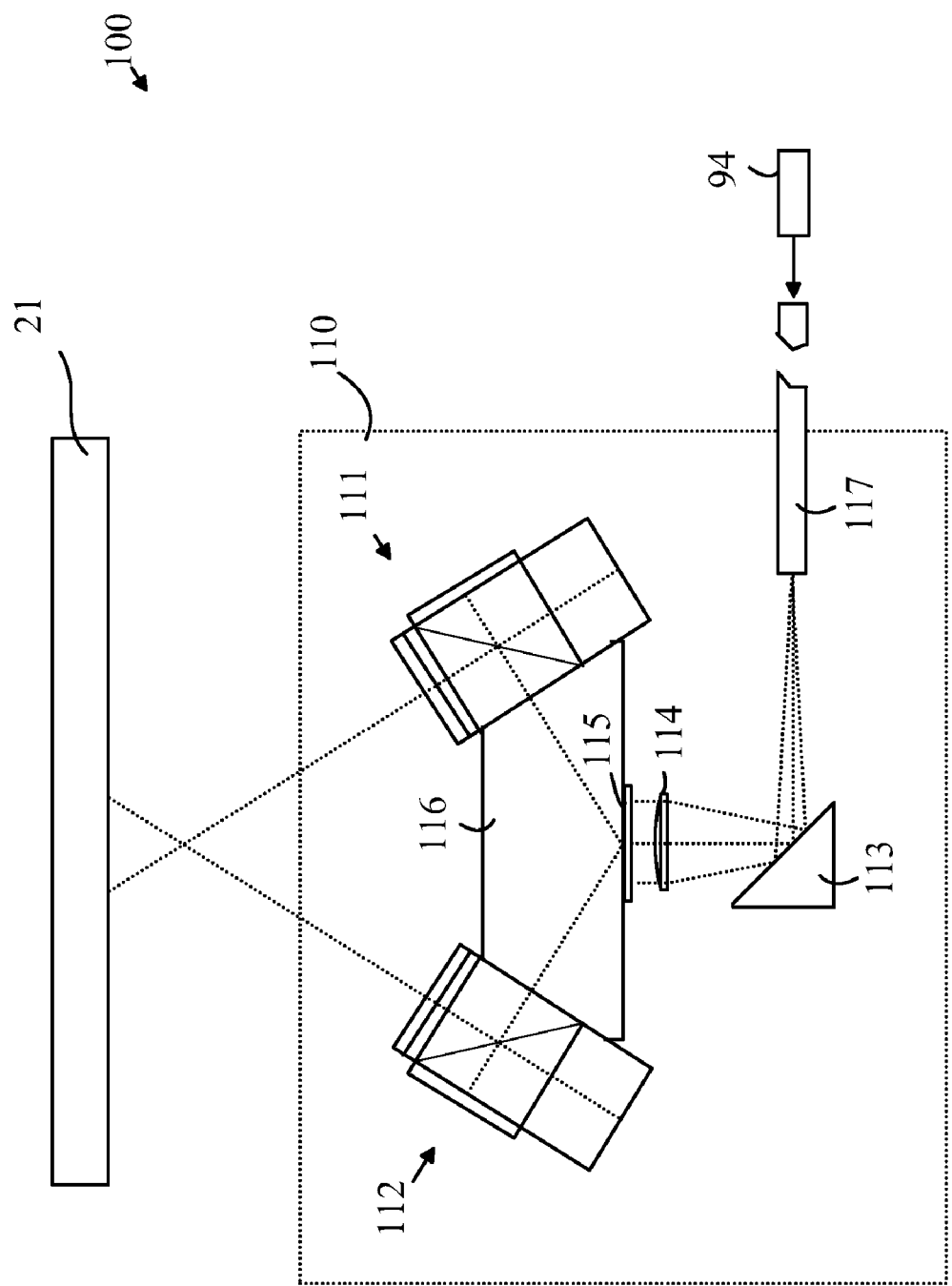
FIG. 7 illustrates a Littrow encoder according to another embodiment of the present invention.

In the above-described embodiments, the light beam from the input light source is divided into two beams by a non-polarization dependent beam splitter such as a half silvered mirror. However, other arrangements could be utilized. Refer now to FIG. 7, which illustrates a Littrow encoder according to another embodiment of the present invention. Littrow encoder 100 is similar to Littrow encoder 70 discussed above in that Littrow encoder 100 includes an optical assembly 110 and a grating 21. Optical assembly 110 includes two dual pass interferometers 111 and 112 that operate in a manner analogous to that described above with respect interferometers 61 and 62. The input beam to each of the interferometers is generated from a common light source 94 that generates a linearly polarized beam at a predetermined wavelength. The output of light source 94, which is typically a laser, is injected into an optical fiber 117 whose output is allowed to expand before being collimated by lens 114. A turning mirror 113 is used to provide a more compact optical arrangement for delivering the expanded beam to a grating 115 that splits the collimated beam from lens 114 into two beams traveling at the desired angles. The grating can be mounted on the outside of a support component 116, which is used to hold the interferometers in the correct positions relative to one another.

Figure 8:
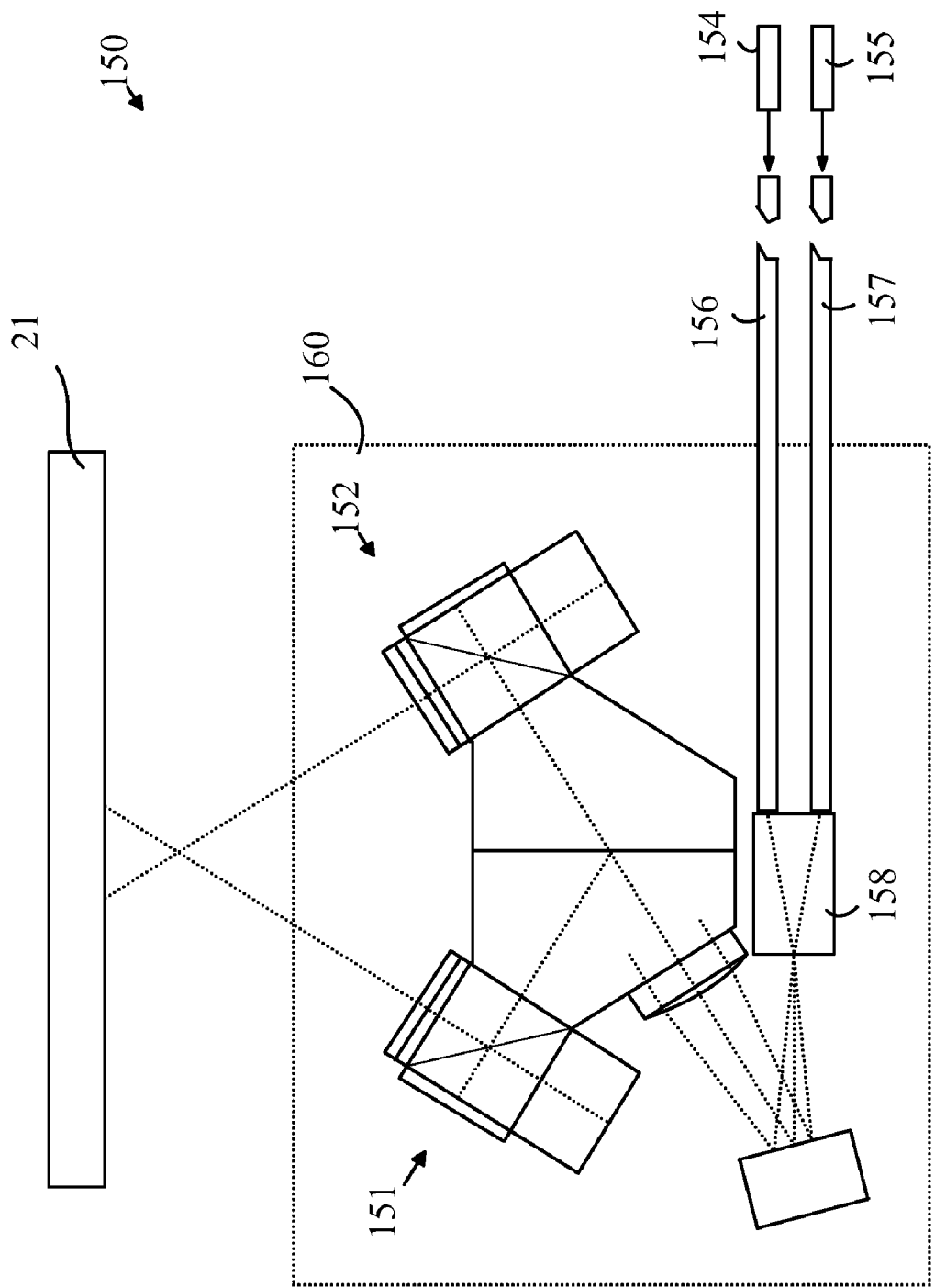
FIG. 8 is a cross-sectional view of a Littrow encoder according to another embodiment of the present invention.

The embodiments discussed above utilize homodyne interferometers; however, embodiments that utilize heterodyne interferometers can also be constructed. Heterodyne interferometers have the advantage of utilizing a simpler detector mechanism; however, such interferometers require an input light source that has two light beams having different frequencies and with polarizations that are orthogonal to one another. Refer now to FIG. 8, which is a cross-sectional view of a Littrow encoder according to another embodiment of the present invention. FIG. 8 is a cross-sectional view through the input plane of Littrow encoder 150. Littrow encoder 150 includes an optical assembly 160 and a grating 21. Optical assembly 160 includes two double pass heterodyne interferometers 151 and 152 that are similar to the heterodyne interferometers discussed above with reference to FIG. 2A. The input light source for each of the two interferometers has two orthogonally linearly polarized components that differ in frequency by an amount that is chosen such that the frequency difference gives rise to a beat signal that is easily detected electronically. Each of the frequency components is generated by a laser. The light from laser 154 is injected into a first polarization maintaining fiber 156, and the light from laser 155 is injected into a second polarization maintaining fiber 157. The orientations of fibers 156 and 157 are set such that the light leaving fiber 156 is polarized in a direction orthogonal to that leaving fiber 157. The output of the two fibers is introduced into a walk-off crystal 158 that combines the two beams into a single beam that is expanded and split in a manner analogous to that discussed above.

Figure 9:
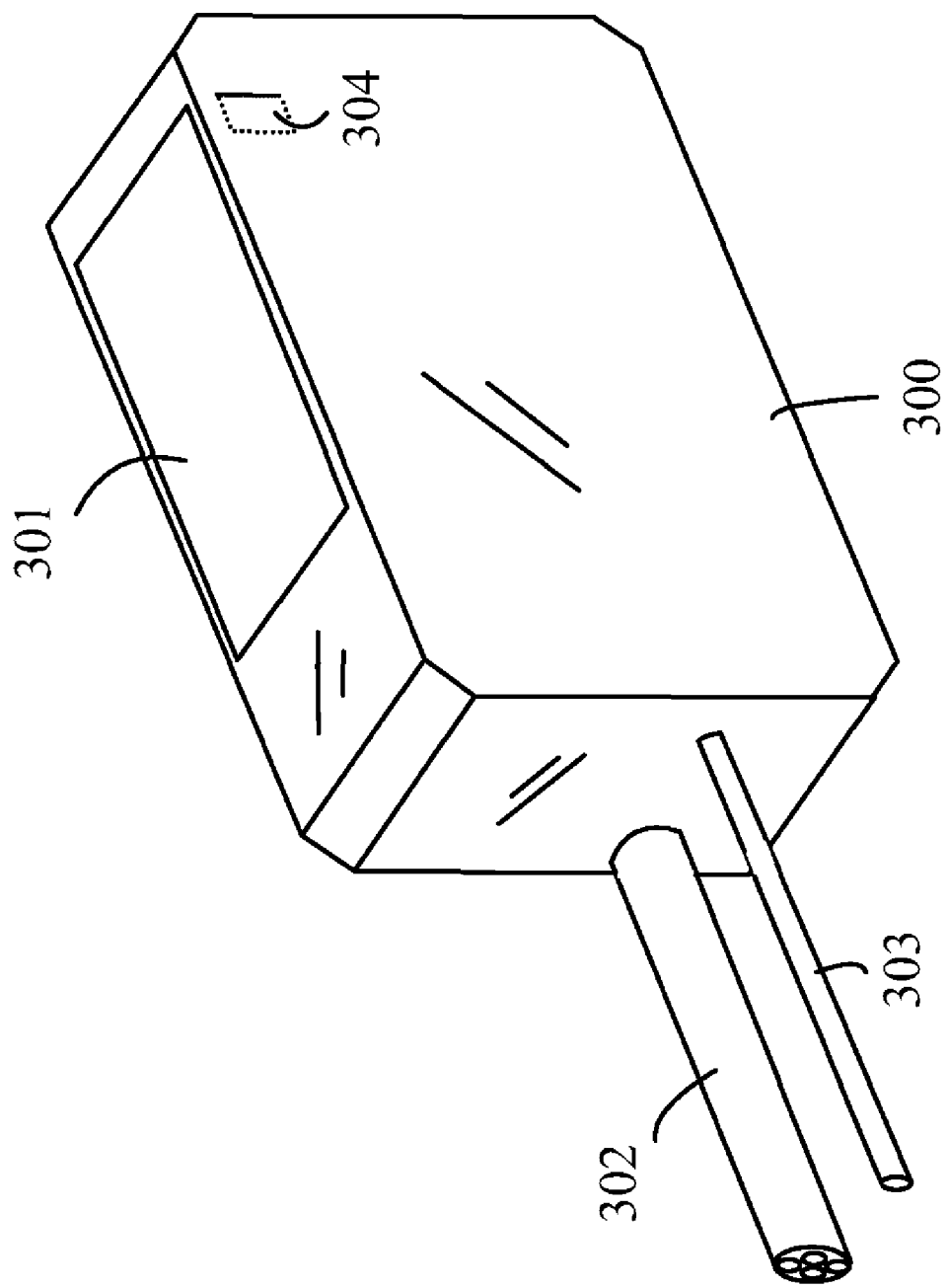
FIG. 9 illustrates a housing arrangement that can be utilized in the present invention.

In one embodiment, the Littrow encoder of the present invention includes a housing that protects the Littrow encoder optics from dust and moisture and provides an environment that can be controlled in temperature. Refer now to FIG. 9, which illustrates a housing arrangement that can be utilized in the present invention. The optical assembly of the Littrow encoder is enclosed in a housing 300 that includes a window 301 that is transparent to light of the wavelength utilized in the interferometers. The light is brought into the housing on a fiber 303, and the electrical signals from the detectors are returned on coaxial cables in cable bundle 302. Housing 300 includes openings to allow the fiber and cables to enter the housing. In one embodiment, the housing includes a hermetic seal in the openings. With the exception of window 301, the housing is opaque to reduce the amount of stray light that the detectors receive. Such stray light results in background signals that must be removed by the processing electronic, and hence, reduces the sensitivity of the system or requires a light source that generates a higher light intensity.

Housing 300 can also include a temperature control module 304 to regulate the temperature within the housing. Temperature control module 304 can include a heating element and a temperature sensor. These elements are connected to appropriate control circuitry that is outside housing 300 through cable bundle 302. While the components of the optical assemblies are typically constructed from the same materials, and hence, have the same coefficients of expansion and indices of refraction, variations in temperature across the optical components can still lead to errors. Hence, in some situations, it is advantageous to provide a uniform temperature environment that reduces such temperature gradients.

Figure 10:
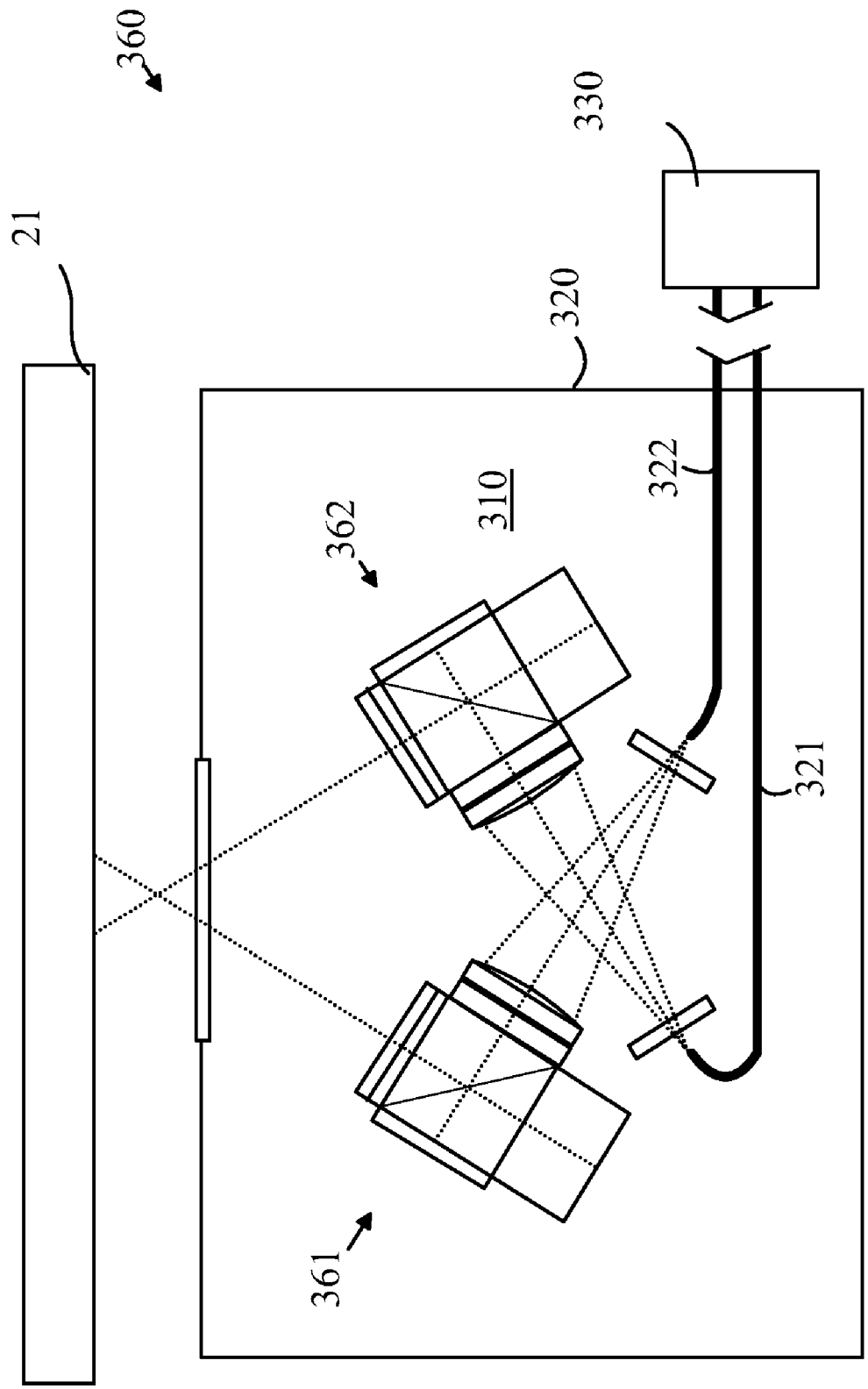
FIG. 10 is a cross-sectional view of Littrow encoder 360 through the output plane of Littrow encoder 360.

In the above-described embodiments of the present invention, the detectors that convert the mixed optical signals to electrical signals are contained within the optical assembly within the housing. However, embodiments in which the detectors are outside the housing can also be constructed. Refer now to FIG. 10, which illustrates a Littrow encoder according to another embodiment of the present invention. FIG. 10 is a cross-sectional view of Littrow encoder 360 through the output plane of Littrow encoder 360. Littrow encoder 360 is similar to the embodiments discussed above in that it includes an optical assembly 310 having first and second interferometers 361 and 362. The embodiment shown in FIG. 10 is a homodyne embodiment, and hence, the light from each of the interferometers is focused to two points in space. Only one of these points for each interferometer in shown in the view in FIG. 10, as the other point is out of the plane through which the cross-section was taken. Instead of placing a detector at each of the points, an optical fiber is positioned to receive the focused light and transmit the light signal to an external electronics assembly 330 that is outside of the housing 320 that surrounds the optical components. Exemplary optical fibers are shown at 321 and 322 in the drawing. Electronics assembly 330 could also include the laser or lasers used to generate the light that is split to provide the input light signals to the interferometer cores.

The above-described embodiments of the present invention utilize double pass interferometers to reduce errors arising from alignment errors in the optical assemblies. However, embodiments in which single pass interferometers are utilized could also be constructed if such alignment-associated errors are not critical in a particular application. Since the cost of such single pass interferometers is less than the double pass interferometers, and since the size of the gradient is also less in such embodiments, single pass interferometers have advantages in some applications.

Various modifications to the present invention will become apparent to those skilled in the art from the foregoing description and accompanying drawings. Accordingly, the present invention is to be limited solely by the scope of the following claims.

What is claimed is:

1. An apparatus comprising:
    a first interferometer;
    a second interferometer; and
    a beam splitter assembly that splits a first instrument light beam into first and second interferometer input beams and directs said first and second interferometer light beams into said first and second interferometers, respectively,
    wherein each interferometer generates a measurement beam and a reference beam from said input beam to that interferometer and directs said measurement beam toward a surface from which said measurement beam is diffracted, said measurement beam from said first interferometer striking said surface at an angle relative to the normal to that surface that is the negative of the angle at which said measurement beam from the other of said interferometers strikes that surface and wherein each interferometer comprises an intensity detector that generates a signal related to an intensity of light in a combined light beam comprising said reference and measurement beams from that interferometer.

2. The apparatus of claim 1 wherein said angle is a Littrow angle of an optical grating on said surface.

3. The apparatus of claim 1 wherein said beam splitter assembly comprises an optical element comprising a transparent medium that is bonded to said first and second interferometers.

4. The apparatus of claim 3 wherein said optical element comprises a non-polarization dependent beam splitter.

5. The apparatus of claim 4 wherein said non-polarization-dependent beam splitter comprises a partially reflecting mirror.

6. The apparatus of claim 4 wherein said non-polarization-dependent beam splitter comprises an optical grating.

7. The apparatus of claim 1 further comprising a beam expanding optical assembly that receives a second instrument light beam characterized by a first cross-sectional area and converts said second instrument light beam to said first instrument light beam, said first instrument light beam having a cross-sectional area greater than said first cross-sectional area and being a collimated light beam.

8. The apparatus of claim 7 wherein said beam expanding optical assembly comprises an optical fiber that transmits said second instrument light beam to said apparatus and a collimating optical assembly that converts diverging light from said optical fiber to said first instrument light beam.

9. The apparatus of claim 1 wherein said first instrument light beam comprises linearly polarized light having a first wavelength.

10. The apparatus of claim 9 wherein said intensity detector in each of said interferometers comprises:
    a beam splitter that separates said combined light signal generated by that interferometer core into first and second detector light signals and images each of said first and second detector light signals to a different point in space;
    a phase retarder that retards a phase of said first detector light signal by 90 degrees relative to said second detector light signal;
    a first polarization filter oriented to mix light of different linear polarizations in said first detector light signal; and
    a second polarization filter oriented to mix light of different linear polarizations in said second detector light signal.

11. The apparatus of claim 1 wherein said first instrument light beam comprises first linearly polarized light having a first wavelength and second linearly polarized light having a second wavelength that is different from said first wavelength.

12. The apparatus of claim 11 further comprising
    a beam expanding optical assembly that receives a second and a third instrument light beams transmitted on a first and a second optical fibers, respectively, said second instrument light beam being displaced in space relative to said third instrument light beam;
    an optical assembly that combines said second and third instrument light beams into a fourth instrument light beam;
    a beam expanding and collimating optical assembly that expands a fourth instrument light signal and collimates said fourth instrument light beam to generate said first instrument light beam.

13. The apparatus of claim 1 further comprising a housing surrounding said first interferometer, said second interferometer, and said beam splitter assembly, said housing comprising an optically transparent window positioned to pass said measurement beams generated by said first and second interferometers.

14. The apparatus of claim 13 further comprising an optical fiber that delivers a second instrument light beam to a point within said housing from a point outside of said housing and an electrical cable that delivers signals from said intensity detectors to a point outside of said housing.

15. The apparatus of claim 13 wherein said intensity detectors are located outside of said housing and said apparatus further comprises optical fibers for coupling a portion of said combined light beams from inside said housing to said intensity detectors.

16. The apparatus of claim 13 wherein said housing comprises a temperature control module that regulates the temperature in said housing.

* * * * *